US009263461B2

(12) United States Patent
Tanzawa

(10) Patent No.: US 9,263,461 B2
(45) Date of Patent: Feb. 16, 2016

(54) APPARATUSES INCLUDING MEMORY ARRAYS WITH SOURCE CONTACTS ADJACENT EDGES OF SOURCES

(71) Applicant: Micron Technology, Inc., Boise, ID (US)

(72) Inventor: Toru Tanzawa, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 42 days.

(21) Appl. No.: 14/200,348

(22) Filed: Mar. 7, 2014

(65) Prior Publication Data

US 2015/0255478 A1 Sep. 10, 2015

(51) Int. Cl.
*H01L 27/115* (2006.01)
*H01L 27/24* (2006.01)

(52) U.S. Cl.
CPC .... *H01L 27/11556* (2013.01); *H01L 27/11582* (2013.01); *H01L 27/249* (2013.01)

(58) Field of Classification Search
None
See application file for complete search history.

(56) References Cited

U.S. PATENT DOCUMENTS

| 6,667,510 B2 | 12/2003 | Wu |
| 2002/0158273 A1 | 10/2002 | Satoh et al. |
| 2004/0094786 A1 | 5/2004 | Tran et al. |
| 2009/0310425 A1* | 12/2009 | Sim et al. ............ 365/185.29 |
| 2010/0193861 A1* | 8/2010 | Shim et al. ............ 257/329 |
| 2010/0320526 A1 | 12/2010 | Kidoh et al. |
| 2012/0043601 A1 | 2/2012 | Maeda et al. |
| 2012/0182808 A1* | 7/2012 | Lue et al. ............ 365/185.18 |
| 2013/0130495 A1 | 5/2013 | Higashitani et al. |
| 2013/0171806 A1 | 7/2013 | Shim et al. |
| 2013/0242654 A1 | 9/2013 | Sim et al. |
| 2013/0279262 A1 | 10/2013 | Yoon et al. |
| 2014/0231954 A1* | 8/2014 | Lue ............................ 257/528 |

OTHER PUBLICATIONS

"International Application Serial No. PCT/US2015/018930, International Search Report mailed Jun. 30, 2015", 3 pgs.
"International Application Serial No. PCT/US2015/018930, Written Opinion mailed Jun. 30, 2015", 6 pgs.

* cited by examiner

*Primary Examiner* — Erik Kielin
(74) *Attorney, Agent, or Firm* — Schwegman Lundberg & Woessner, P.A.

(57) ABSTRACT

Various apparatuses, including three-dimensional (3D) memory devices and systems including the same, are described herein. In one embodiment, a 3D memory device can include at least two sources; at least two memory arrays respectively formed over and coupled to the at least two sources; and a source conductor electrically respectively coupled to the at least two sources using source contacts adjacent one or more edges of the source. Each of the at least two memory arrays can include memory cells, control gates, and data lines. There is no data line between an edge of a source and the source contacts adjacent the edge.

26 Claims, 10 Drawing Sheets

APPARATUSES INCLUDING MEMORY ARRAYS WITH SOURCE CONTACTS ADJACENT EDGES OF SOURCES

BACKGROUND

With the development of the semiconductor industry, three-dimensional (3D) semiconductor devices are getting more attractive due to their increased storage capability. In a 3D memory device, a source is generally routed using interconnection layers including source contacts. Some memory devices may include source contacts inside memory arrays. However, a large number of source contacts in a memory array of a memory device may degrade the efficiency of the memory array and result in a large die size and a high fabrication cost.

DESCRIPTION OF THE EMBODIMENTS

The following detailed description refers to the accompanying drawings which show, by way of illustration, specific aspects and embodiments in which the present subject matter may be practiced. These embodiments are described in sufficient detail to enable those skilled in the art to practice the present subject matter.

The term "horizontal" as used in this application is defined as a plane parallel to the conventional plane or surface of a substrate, such as a wafer or portion thereof, regardless of the actual orientation of the wafer or substrate. The term "vertical" refers to a direction perpendicular to the horizontal as defined above. Prepositions, such as "on," "side," "higher," "lower," "over," "below," and "under" are defined with respect to the conventional plane or surface being on the top surface of the wafer or substrate, regardless of the actual orientation of the wafer or substrate.

The terms "wafer" and "substrate" are used herein to refer generally to any structure on which integrated circuits are formed, and also to such structures during various stages of integrated circuit fabrication. The following detailed description is, therefore, not to be taken in a limiting sense, and the scope of the present subject matter is defined only by the appended claims, along with the full scope of equivalents to which such claims are entitled.

NAND array architecture is an array of memory cells arranged such that the memory cells are coupled in logical rows to access lines, which are conventionally referred to as word lines. The access lines are coupled to, and in some cases are at least partially formed by, the Control Gates (CGs) of the memory cells. A string of memory cells of the array are coupled together in series between a source and a data line, which is conventionally referred to as a bit line.

Memory cells in the NAND array architecture can be programmed to a desired data state. A memory cell conventionally can be programmed to a desired one of at least two data states (e.g., a "1" or a "0" state). Memory cells conventionally can be programmed to a desired one of more than two data states.

Figure 1:
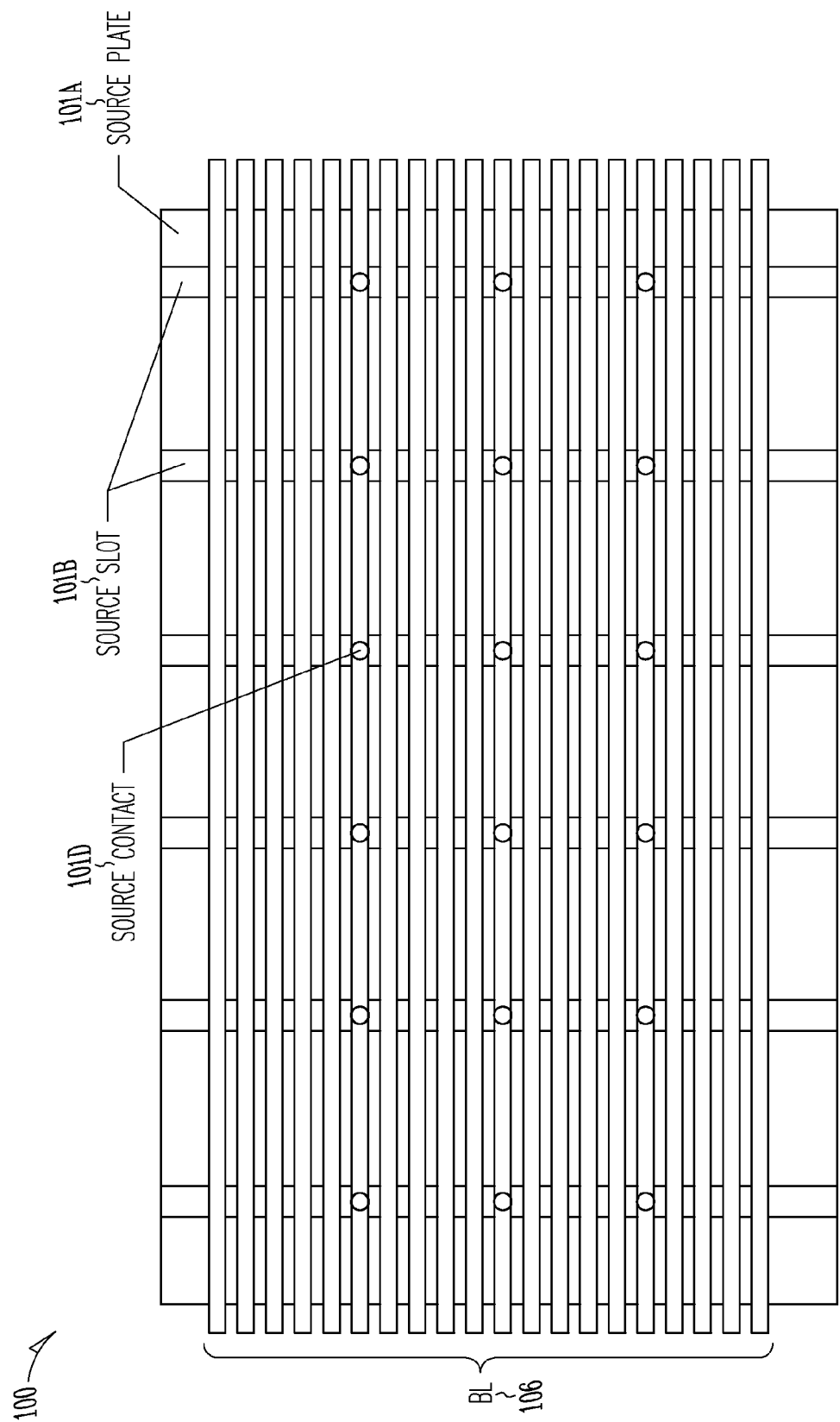
FIG. 1 is a top view of a memory device, according to a prior art.

FIG. 1 is a top view of an apparatus in the form of a 3D memory device, according to a prior architecture contemplated by the applicant. As shown in FIG. 1, a 3D memory device 100 (e.g., a 3D NAND array structure) may include a source plate 101A, source slots 101B, and bit lines (BL) 106 for example. The source plate 101A may be routed to a source terminal (e.g., a Common Source Line or "CSL") of the memory device 100 via conductive source contacts 101D. However, frequent source contacts 101D inside the array structure may degrade the array efficiency of the 3D memory device 100. Since the currents of all the NAND strings in the same block may flow into the CSL, the CSL confronts a challenge that the sheet resistance in the CSL has to be low enough to reduce the source noise. Furthermore, additional space used between neighbor blocks may cause an overhead on the block pitch, which may result in a large die size and a high fabrication cost.

Figure 2A:
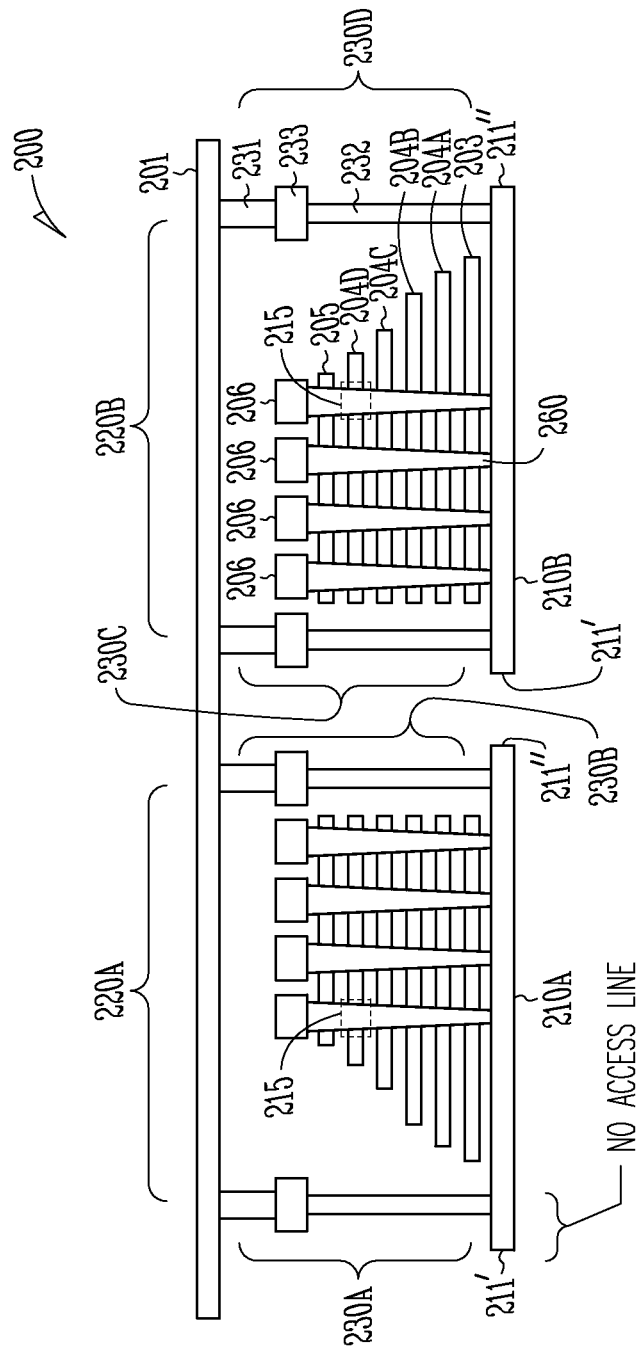
FIG. 2A is a side cross-sectional view of a memory device, according to an embodiment.

FIG. 2A is a side cross-sectional view of a 3D memory device 200, according to an embodiment of the subject matter. The 3D memory device 200 may include divided sources 210 (e.g., source plates/regions 210A and 210B, which are separated from each other), and divided memory arrays 220 (e.g., 220A and 220B). The divided memory arrays 220 may be respectively formed over (e.g., on) and coupled to the divided sources 210. A source (e.g., 210A) of the divided sources may include an edge 211' on one side and an edge 211" on the opposite side. For purposes of brevity and clarity, same tiers, regions, and/or elements in a 3D memory device will be identified by the same reference numerals throughout FIGS. 2-7.

In an embodiment, the divided sources 210 may comprise a metal material or a combination of metal and silicon (e.g., a WSi material). In another embodiment, the divided sources 210 may comprise a stack of metal material and polysilicon material. In still another embodiment, the divided sources 210 may comprise a stack of polysilicon material and a combination of metal and silicon (e.g., a WSi material). In a further embodiment, the divided sources 210 may comprises doped regions of a semiconductor substrate. Embodiments of the present invention, however, are not limited to any particular one of the above-described sources.

In an embodiment, a memory array (e.g., 220A) of the divided memory arrays 220 may include memory cells 215, vertical pillars 260, a source conductor (e.g., a source line) 201, a ground select line (GSL)/source select gate (SGS) 203, control gates/word lines (CGs/WLs) 204A, 204B, 204C and 204D), a string select line (SSL)/drain select gate (SGD) 205, and data lines 206. In another embodiment, the memory array (e.g., 220A) of the divided memory arrays 220 may include a plurality of source conductors 201. Each memory cell 215 may be electrically coupled to a control gate of the control gates 204, and a data line of the data lines 206. In an embodiment, the control gates 204 may include word lines (WL) 204A-204D, and the data lines 206 may include bit lines (BL) 206 for example.

In an embodiment, the source conductor 201 may be electrically coupled to both of the divided sources 210 through source contacts 230 (such as 230A, 230B, 230C and 230D). In an embodiment, a source contact 230 of the source contacts 230 may include a first contact (e.g., a first plug) 231 to contact the at least one source conductor 201, a second contact (e.g., a second plug) 232 to contact a source (e.g., 210A) of the at least two divided sources 210, and a conductive connector 233 to contact the first contact 231 and the second contact 232.

Figure 2B:
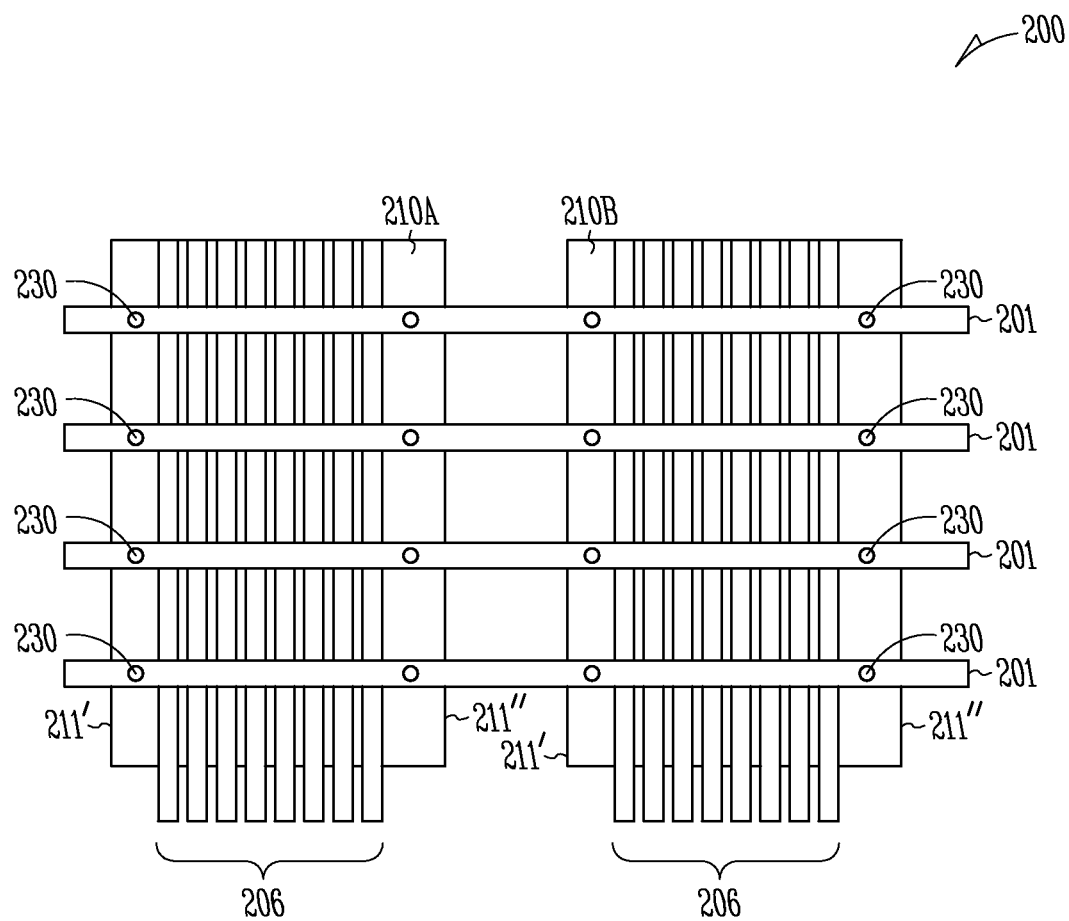
FIG. 2B is a top view of the memory device as shown in FIG. 2A, according to an embodiment.

FIG. 2B is a top view of the memory device 200 as shown in FIG. 2A, according to an embodiment. As shown in FIG. 2B, the source conductors 201 may be coupled to the divided sources 210 through source contacts 230 adjacent edges of the sources 210. There is no data line 206 between an edge 211 (e.g., 211') of a source 210 (e.g., 210A) and the source contacts 230 adjacent to the edge 211. For example, there is no data line 206 between an edge 211' of the source 210A and the source contacts 230 adjacent to the edge 211', and there is no data line 206 between an edge 211" of the source 210A and the source contacts 230 adjacent to the edge 211".

Figure 4A:
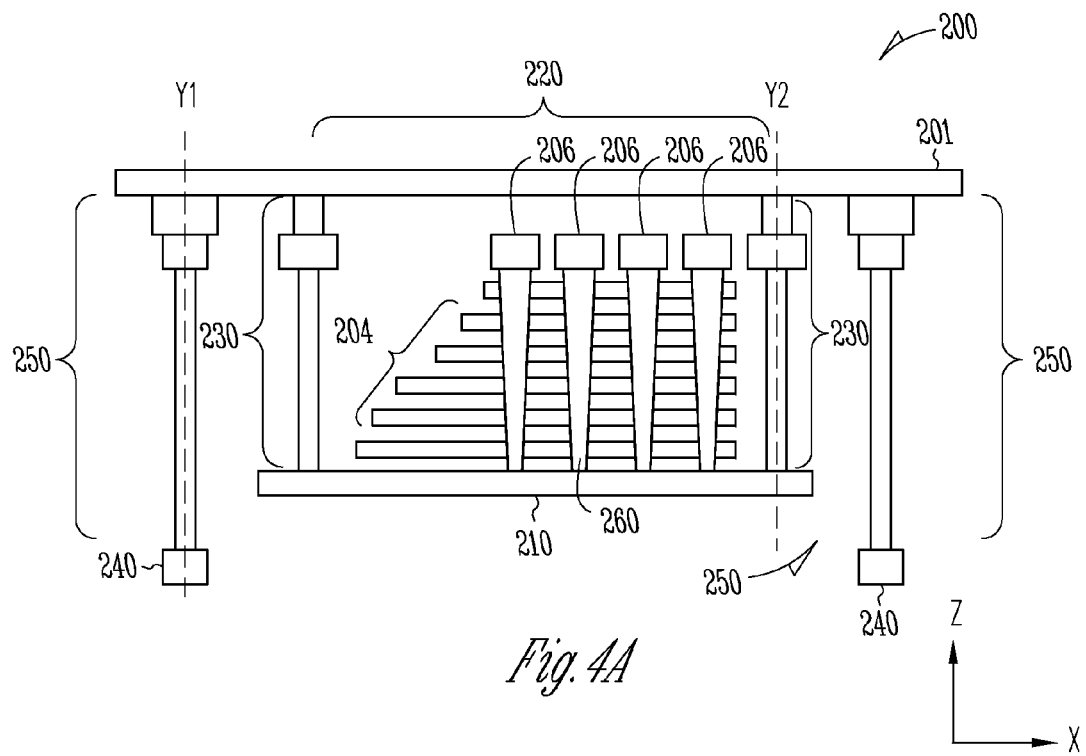
FIG. 4A is a side cross-sectional view of a memory device, according to an embodiment.

As shown in FIGS. 2A and 2B, an array 220 (e.g., 220A) may share control gates 204 or data lines 206 without source routing (such as source contacts) inside the array 220. An amount of current between a data line 206 of each memory cell and the source conductor 201 can be used as binary data of the memory cell. The source noise can be reduced. Additionally, since the contacts are placed adjacent an edge of an array in a control gate direction, (e.g., WL direction), the die size overhead can be reduced. The control gate direction may be the "X" direction as shown in FIG. 4A.

Figure 3A:
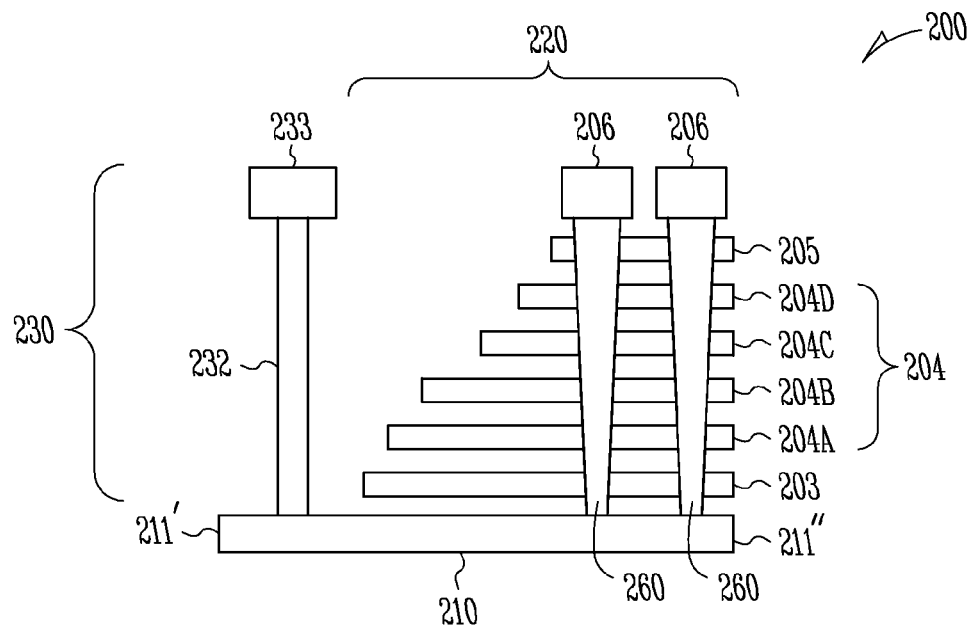
FIG. 3A is a side cross-sectional view of a memory device, according to an embodiment.
Figure 3B:
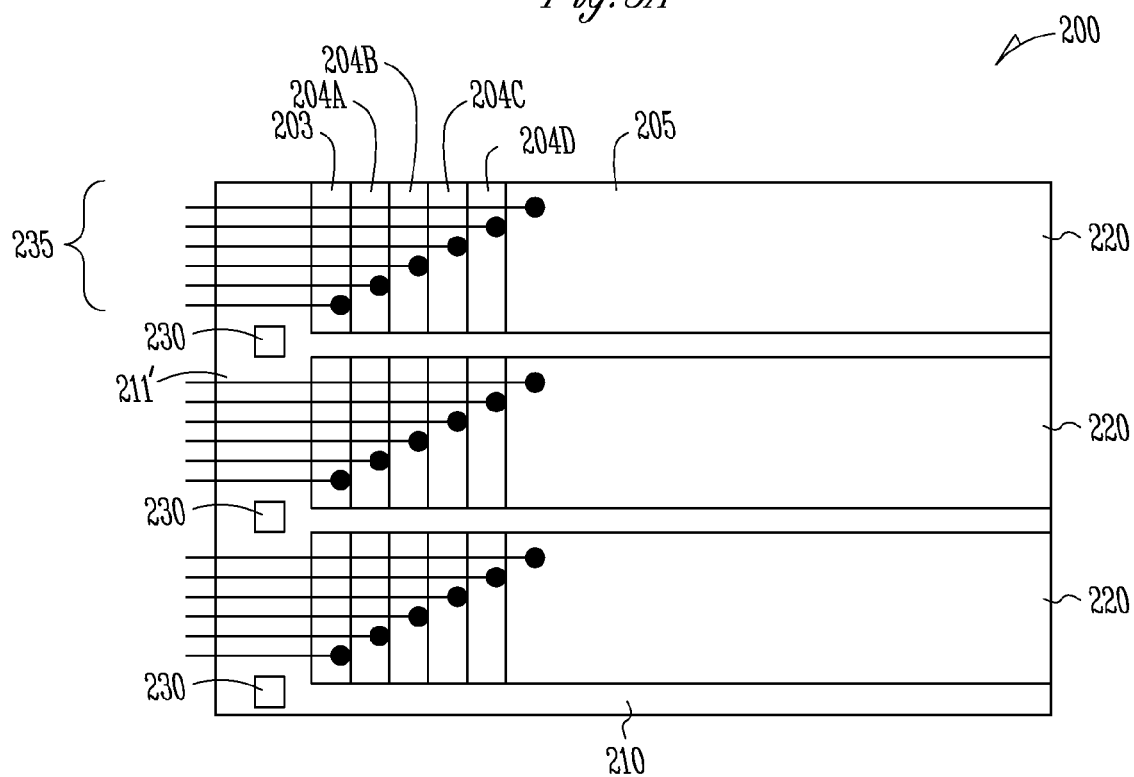
FIG. 3B is a top view of the memory device as shown in FIG. 3A, according to an embodiment.

FIG. 3A is a side cross-sectional view of a memory device according to an embodiment, and FIG. 3B is a top view of the memory device as shown in FIG. 3A. As shown in FIGS. 3A and 3B, a memory device 200 may include a source 210, and a memory array 220 formed over (e.g., on) and coupled to the source 210. In an embodiment, the memory array 220 may include memory cells 215 (as indicated in e.g., FIG. 2A), vertical pillars 260, a ground select line (GSL) 203, control gates 204 (such as word lines WL including 204A-D), a string select line (SSL) 205, and data lines 206. Control gates 204 may be coupled to control gate contacts.

In an embodiment, a source conductor 201 (as shown in e.g., FIG. 2A) may be electrically coupled to the source 210 through one or more conductive source contacts 230 adjacent an edge 211' of the source 210. There is no data line 206 between the edge 211' of the source 210 and the source contacts 230.

In an embodiment, as shown in FIGS. 3A and 3B, the source conductor 201 is electrically coupled to the source 210 using the source contacts 230 adjacent an edge 211' of the source 210 in an control gate (e.g., word line WL 204) direction, and the source contacts 230 may contact the source 210 adjacent the edge 211' of the source 210 on a side of and between groups of control gate contacts 235.

Figure 3C:
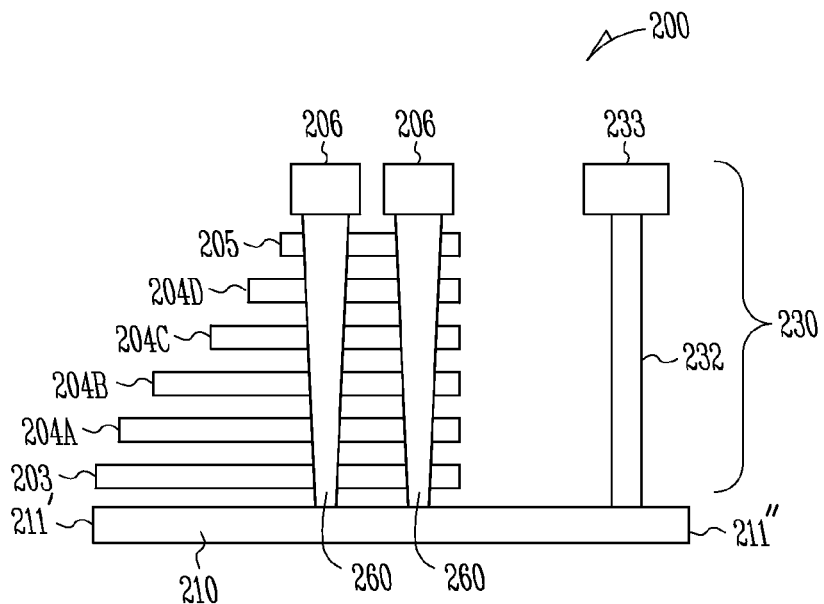
FIG. 3C is a side cross-sectional view of a memory device, according to an embodiment.
Figure 3D:
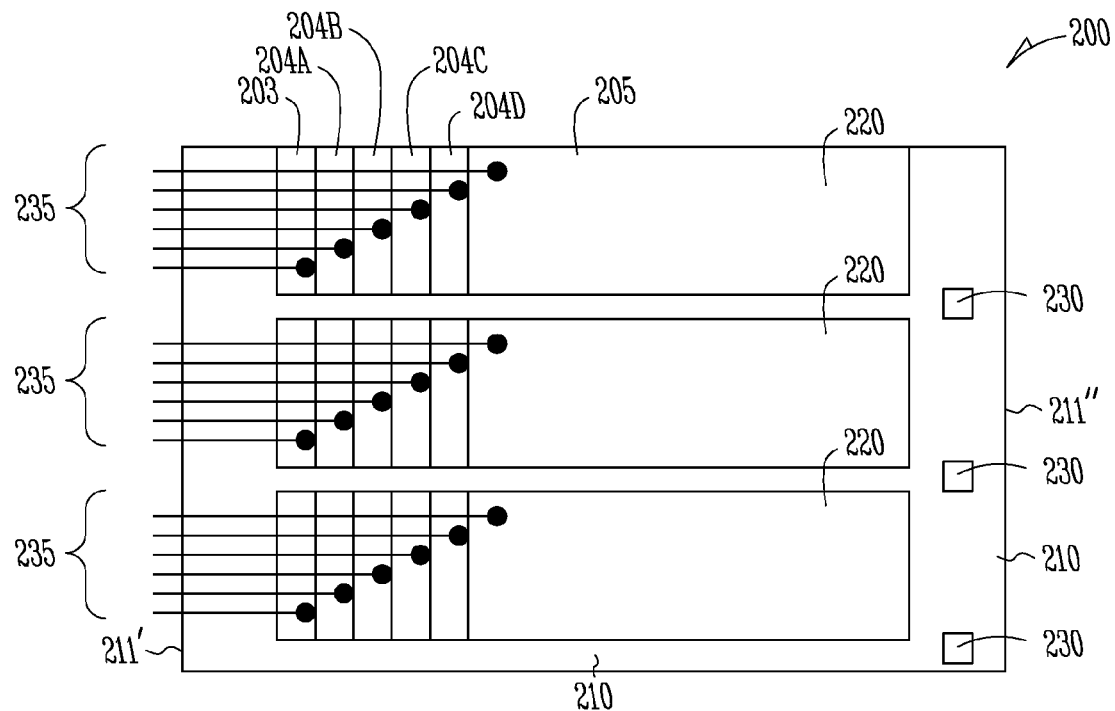
FIG. 3D is a top view of the memory device as shown in FIG. 3C, according to an embodiment.

FIG. 3C is a side cross-sectional view of a memory device, according to another embodiment. FIG. 3D is a top view of the memory device as shown in FIG. 3C. In an embodiment, a source conductor 201 (as shown in FIG. 2A) is electrically coupled to the source 210 using the source contacts 230 adjacent an edge 211" of the source 210 in an control gate (e.g., WL 204) direction, and the source contacts 230 may contact the source 210 at the edge 211" of the source 210 on a side opposite to the groups of control gate contacts 235.

In an embodiment, as shown in FIGS. 2A and 2B, the source contacts 230 may contact a source 210 (e.g., the source 210A) adjacent both of the edges 211' and 211" of the source 210.

Figure 4B:
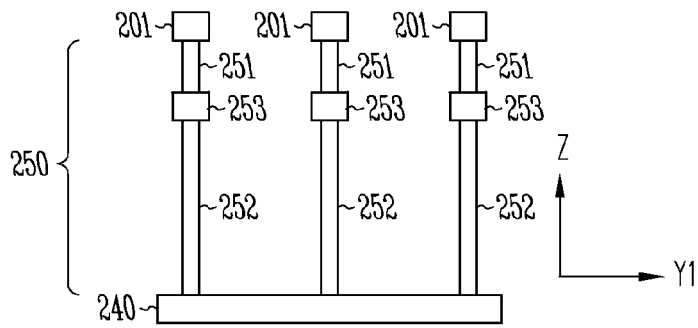
FIG. 4B is another side cross-sectional view of the memory device as shown in FIG. 4A, according to an embodiment.

In another embodiment, not shown in the figures, a source conductor 201 is electrically coupled to the source 210 using the source contacts 230 adjacent an edge of the source 210 in a data line (e.g., bit line BL) 206 direction. The data line direction may be the "Y1" direction as shown in FIGS. 4A and 4B.

FIG. 4A is a side cross-sectional view of a memory device 200, according to an embodiment. A 3D memory device 200 may include one (or more) memory array 220, one (or more) source conductor 201, and one (or more) interconnection component 240. In an embodiment, the memory array 220 may be coupled to a source 210, and may include memory cells 215, control gates 204, and data lines 206. In an embodiment, the source conductor 201 may extend over the memory array 220, and may be coupled to the source 210 using source contacts 230 adjacent one (or more) edge of the source 210.

In an embodiment, the memory array 220 may include a plurality of tiers of a first semiconductor material (such as poly-silicon material) to be used as the control gates 204 for example, and the memory array 220 may also include a plurality of vertical pillars 260 of a second semiconductor material (such as poly-silicon material) to be used as channels.

In an embodiment, the interconnection component 240 may extend perpendicular to the source conductor 201 and may be electrically coupled to the source conductor 201 using conductive interconnection contacts 250. In an embodiment, the interconnection component 240 may extend below the source 210.

FIG. 4B is another side cross-sectional view of the memory device 200 along the Y1 direction as shown in FIG. 4A, according to an embodiment. In an embodiment, as shown in FIG. 4B, the conductive interconnection contact 250 may include a first contact 251 to contact the source conductor 201, a second contact 252 to contact the interconnection component 240, and a third contact 253 to contact both the first contact 251 and the second contact 252.

Figure 4C:
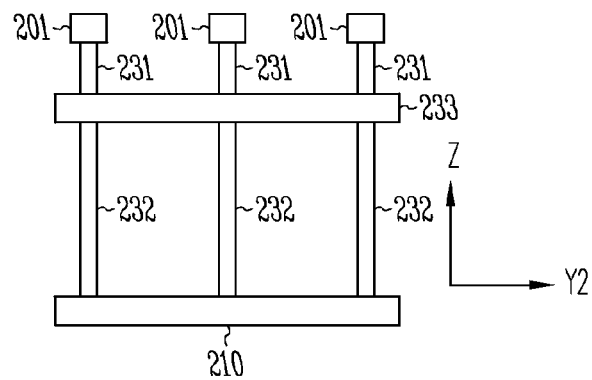
FIG. 4C is still another side cross-sectional view of the memory device as shown in FIG. 4A, according to an embodiment.

FIG. 4C is still another side cross-sectional view of the memory device 200 along the Y2 direction as shown in FIG. 4A, according to an embodiment. In an embodiment, as shown in FIG. 4C, a conductive source contact 230 (such as 230A as shown in FIG. 2A) may include a first contact 231 to contact the source conductor 201, a second contact 232 to contact the source 210, and a third contact 233 to contact both the first contact 231 and the second contact 232.

Figure 5A:
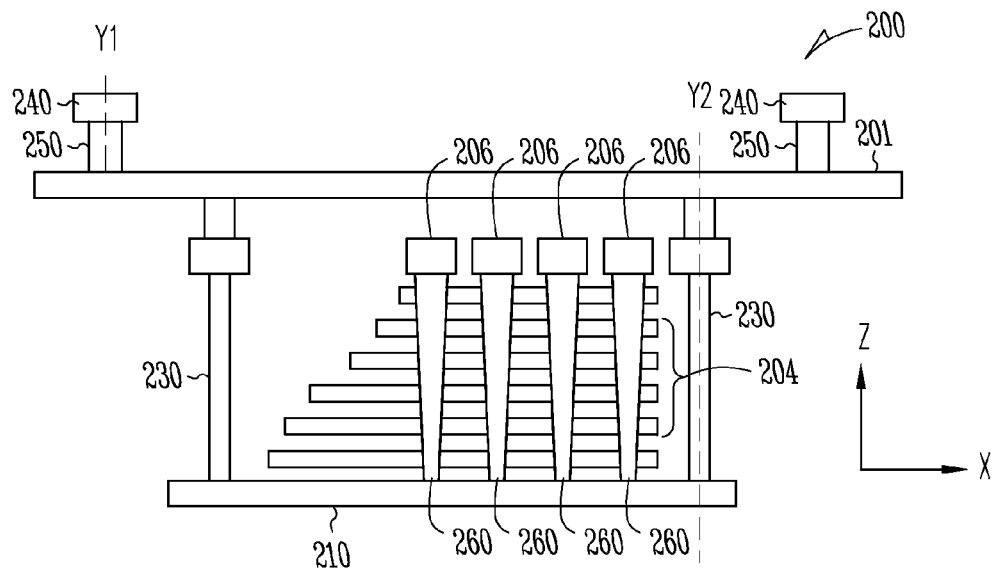
FIG. 5A is a side cross-sectional view of a memory device, according to an embodiment.

FIG. 5A is a side cross-sectional view of a memory device 200, according to an embodiment. The 3D memory device 200 may include one (or more) memory array 220 (such as 220A as shown in FIG. 2A), one (or more) source conductor 201, and one (or more) interconnection component 240. In an embodiment, the memory array 220 may be electrically coupled to a source 210, and may include memory cells 215 (as shown in FIG. 2A), control gates 204, and data lines 206. In an embodiment, the source conductor 201 may extend over the memory array 220, and may be electrically coupled to the source 210 using source contacts 230 adjacent one or more edges of the source 210.

In an embodiment, the interconnection component 240 may extend perpendicular to the source conductor 201 and may be electrically coupled to the source conductor 201 using interconnection contacts 250. In an embodiment, the interconnection component 240 may extend over the source 210.

Figure 5B:
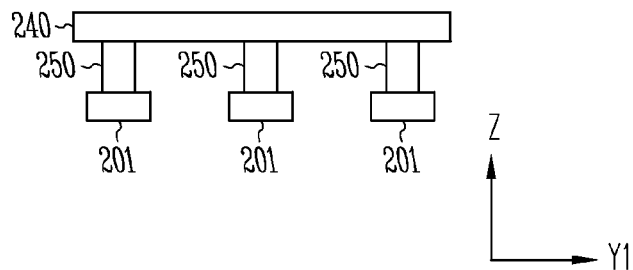
FIG. 5B is another side cross-sectional view of the memory device as shown in FIG. 5A, according to an embodiment.

FIG. 5B is another side cross-sectional view of the memory device 200 along the Y1 direction as shown in FIG. 5A, according to an embodiment. In an embodiment, an interconnection contact 250 may include a single conductive contact.

Figure 5C:
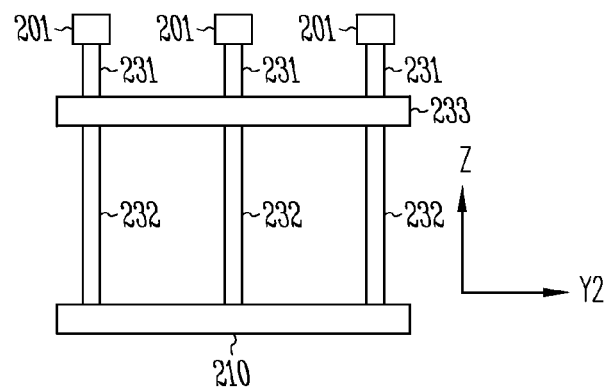
FIG. 5C is still another side cross-sectional view of the memory device as shown in FIG. 5A, according to an embodiment.

FIG. 5C is still another side cross-sectional view of the memory device 200 along the Y2 direction as shown in FIG. 5A, according to an embodiment. In an embodiment, a conductive source contact 230 (as shown in FIG. 5A) may include a first contact 231 to contact the source conductor 201, a second contact 232 to contact the source 210, and a third contact 233 to contact both the first contact 231 and the second contact 232.

Figure 6A:
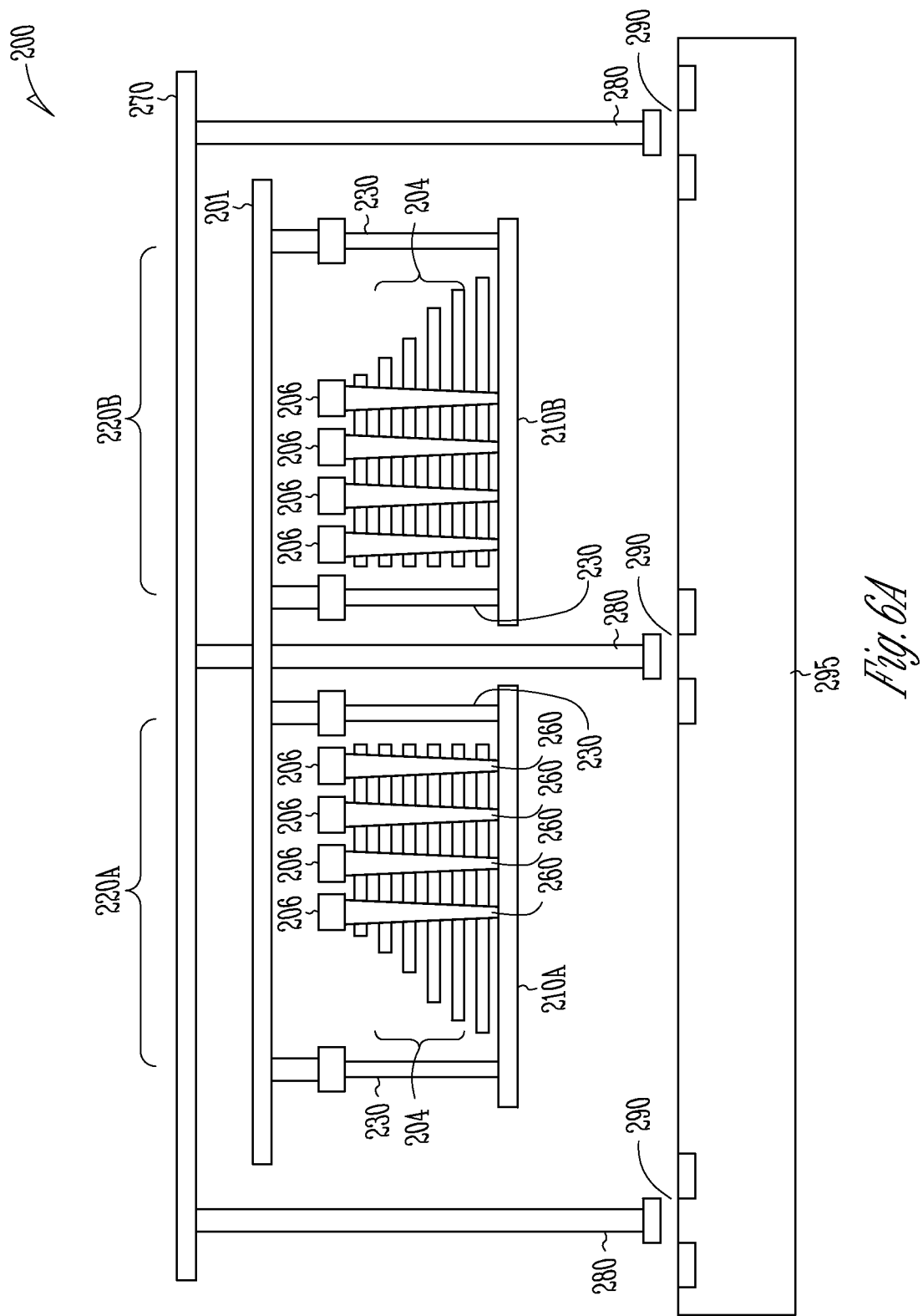
FIG. 6A is a side cross-sectional view of a memory device, according to an embodiment.
Figure 6B:
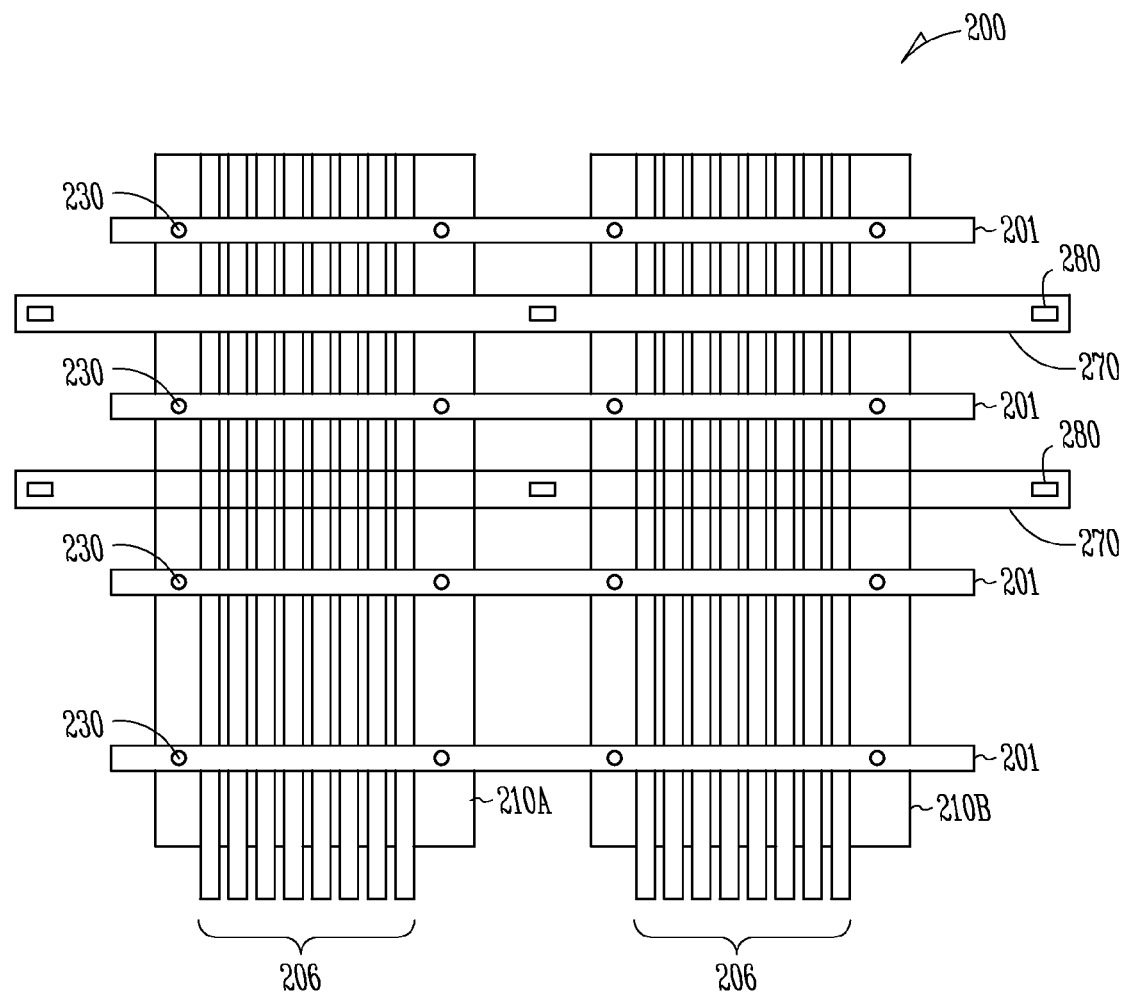
FIG. 6B is a top view of the memory device as shown in FIG. 6A, according to an embodiment.

FIG. 6A is a side cross-sectional view of a memory device 200, according to an embodiment. FIG. 6B is a top view of the memory device 200 as shown in FIG. 6A, according to an embodiment. The 3D memory device 200 may include divided sources 210 (such as 210A and 210B), memory arrays 220 (such as 220A and 220B) respectively coupled to the divided sources 210, a source conductor 201, and a signal conductor (e.g., a signal line) 270.

As shown in FIGS. 6A and 6B, each memory array 220 may include memory cells 215 (as shown in FIG. 2A), control gates 204 (such as word lines WL), and data lines 206 (such as bit lines BL). The source conductor 201 may extend over the memory arrays 220, and may be electrically coupled to the divided sources 210 using source contacts 230 adjacent one or more edges of each of the at least two divided sources 210.

In an embodiment, the signal conductor 270 may extend parallel with the source conductor 201. The signal conductor 270 may be electrically coupled to gates of transistors 290 using signal contacts 280 to provide control signals to the memory arrays 220. In an embodiment, the transistors 290 may be formed on a same semiconductor substrate 295. The semiconductor substrate 295 may include silicon, or other semiconductor materials.

Figure 7:
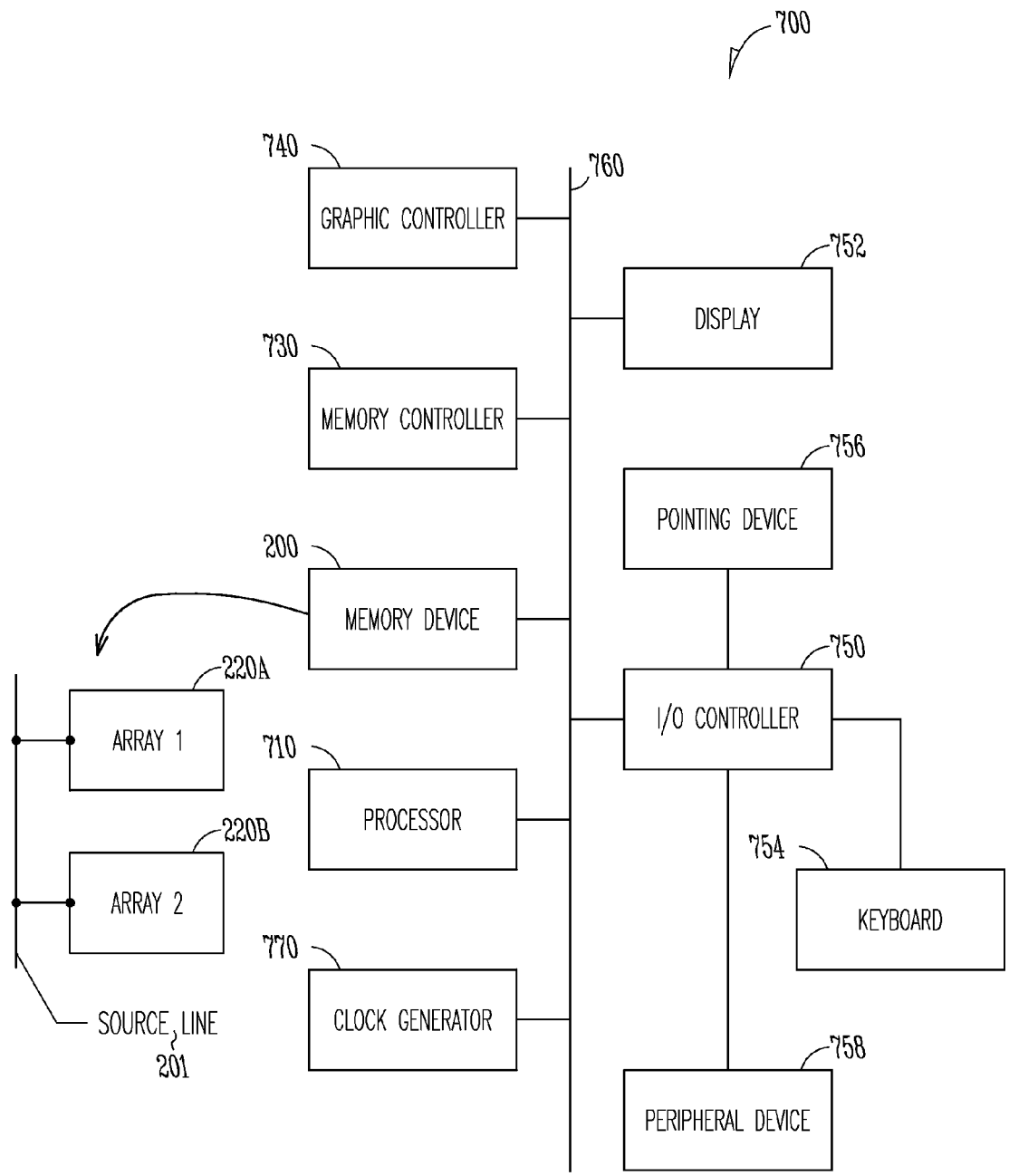
FIG. 7 is a diagram illustrating a system, according to an embodiment.

FIG. 7 is a diagram illustrating an apparatus in the form of a system 700, according to various embodiments of the subject matter. The system 700 may include a processor 710, a memory device 200, a memory controller 730, a graphic controller 740, an input and output (I/O) controller 750, a display 752, a keyboard 754, a pointing device 756, and a peripheral device 758. A bus 760 couples all of these devices together. A clock generator 770 is coupled to the bus 760 to provide a clock signal to at least one of the devices of the system 700 through the bus 760. The clock generator 770 may include an oscillator in a circuit board such as a motherboard. Two or more devices shown in system 700 may be formed in a single integrated circuit chip.

The bus 760 may be interconnect traces on a circuit board or may be one or more cables. The bus 760 may couple the devices of the system 700 by wireless means such as by electromagnetic radiations (for example, radio waves). The peripheral device 758 coupled to the I/O controller 750 may be a printer, an optical device such as a CD-ROM and DVD reader and writer, a magnetic device reader and writer such as a floppy disk driver, or an audio device such as a microphone.

The memory device 200 as shown in FIG. 7 may be a 3D NOT-AND-LOGIC (NAND) memory device for example. The memory device 200 may comprise one of the memory devices 200 described herein and shown in the FIGS. 2-6, according to various embodiments of the disclosure. In an embodiment, the memory device 200 may comprise divided memory arrays 220 (such as 220A and 220B), which may be electrically coupled to divided sources 210 (such as 210A and 210B as shown in FIG. 2A), and may share a source conductor 201, for example. Each memory array 220 may include memory cells 215, one or more control gates 204 (such as word lines WL), one or more data lines 206 (such as bit lines BL), and a source 210 of the divided sources 210, for example. The source conductor 201 may extend over the memory arrays 220, and may be electrically coupled to the divided sources 210 using source contacts 230 adjacent one or more edges of the divided sources 210.

In another embodiment, the memory device 200 may include only one memory array (such as 220A), which includes only one source 210. The source conductor 201 may extend over the memory array 220, and may be electrically coupled to the source 210 using source contacts 230 adjacent one or more edges of the source 210.

The system 700, as shown in FIG. 7, may include computers (e.g., desktops, laptops, hand-holds, servers, Web appliances, routers, etc.), wireless communication devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio Layer 3) players, video games, watches, etc.), and the like.

The above description and the drawings illustrate some embodiments of the application to enable those skilled in the art to practice the embodiments of the application. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description.

The invention claimed is:

1. An apparatus comprising:
   at least two sources;
   at least two memory arrays respectively formed over and coupled to the at least two sources, wherein each of the at least two memory arrays includes vertical strings of memory cells, control gates, and data lines; and
   a source conductor coupled to the at least two sources respectively using source contacts adjacent source edges, wherein there is no data line between a source edge of the source edges and a source contact of the source contacts for each of the at least two sources, wherein each of the source contacts includes a first contact electrically coupled to the source conductor, a second contact electrically coupled to a source of the at least two sources, and a conductive connector connecting the first and second contacts.

2. The apparatus of claim 1, wherein each of the at least two sources comprises metal material.

3. The apparatus of claim 1, wherein each of the at least two sources comprises WSi.

4. The apparatus of claim 1, wherein each of the at least two sources comprises a stack of metal material and polysilicon.

5. The apparatus of claim 1, wherein each of the at least two sources comprises a stack of polysilicon and WSi.

6. An apparatus comprising:
a source;
a memory array formed over and coupled to the source, the memory array including vertical strings of memory cells, control gates, and data lines; and
a source conductor coupled to the source through a source contact adjacent an edge of the source, wherein there is no data line between the edge of the source and the source contact, wherein the source conductor extends over the memory array, and further comprising an interconnection component extending perpendicular to the source conductor and coupled to the source conductor using an interconnection contact.

7. The apparatus of claim 6, wherein the source contact comprises a plurality of source contacts, and further wherein there is no source routing inside the memory array.

8. The apparatus of claim 6, wherein the source contact is adjacent the edge of the source in a control gate direction.

9. The apparatus of claim 6, wherein the source contact is adjacent the edge of the source on a side of and between groups of control gate contacts.

10. The apparatus of claim 6, wherein the source contact is adjacent the edge of the source on a side opposite to groups of control gate contacts.

11. The apparatus of claim 6, wherein the source contact comprises a first source contact, and wherein a second source contact is adjacent another edge of the source.

12. The apparatus of claim 6, wherein the interconnection component extends below the source.

13. The apparatus of claim 6, wherein the source extends between the source conductor and the interconnection component.

14. The apparatus of claim 6, wherein the interconnection contact includes a first contact electrically coupled to the source conductor, a second contact electrically coupled to the interconnection component, and a third contact connecting the first contact and the second contact.

15. The apparatus of claim 6, wherein the interconnection component extends over the source conductor.

16. The apparatus of claim 6, wherein the source conductor extends between the interconnection component and the source.

17. The apparatus of claim 6, wherein the interconnection contact comprises a single conductive plug.

18. The apparatus of claim 6, wherein the control gates comprise a plurality of tiers of a first semiconductor material.

19. The apparatus of claim 18, wherein the first semiconductor material comprises polysilicon.

20. The apparatus of claim 19, wherein the memory array comprises a plurality of vertical pillars of a second semiconductor material.

21. The apparatus of claim 20, wherein the second semiconductor material comprises polysilicon.

22. An apparatus comprising:
at least two sources;
at least two memory arrays respectively coupled to the at least two sources, each of the at least two memory arrays including memory cells, control gates, and data lines;
a source conductor over the at least two memory arrays, and coupled to the at least two sources through source contacts adjacent edges of the at least two sources; and
a signal conductor parallel with the source conductor, and coupled to gates of transistors to provide control signals to the at least two memory arrays.

23. The apparatus of claim 22, wherein the transistors are formed on a same semiconductor substrate.

24. The apparatus of claim 23, wherein the semiconductor substrate comprises silicon.

25. The apparatus of claim 1, wherein the at least two memory arrays and the source conductor are included in a memory device, and wherein the memory device is coupled to a memory controller and/or a processor to send a control signal to the at least two memory arrays.

26. The apparatus of claim 1, wherein there is no source routing inside any of the at least two arrays.

* * * * *